(12) United States Patent
Paterno

(10) Patent No.: US 6,479,310 B1
(45) Date of Patent: Nov. 12, 2002

(54) METHOD FOR TESTING A SEMICONDUCTOR INTEGRATED CIRCUIT DEVICE

(75) Inventor: David Joseph Paterno, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/476,807

(22) Filed: Jan. 3, 2000

(51) Int. Cl.[7] .......................... G01R 31/26; H01L 21/66
(52) U.S. Cl. ...................... 438/17; 438/15; 438/467; 365/201
(58) Field of Search .................. 438/14, 15, 17, 438/18, 466, 467; 365/96, 201, 225.7

(56) References Cited

U.S. PATENT DOCUMENTS

| | | | |
|---|---|---|---|
| 5,617,366 A | 4/1997 | Yoo .......................... 365/201 |
| 5,661,729 A | * 8/1997 | Miyazaki et al. ........... 365/201 |
| 5,712,588 A | 1/1998 | Choi et al. .................. 327/525 |
| 5,764,655 A | * 6/1998 | Kirihata et al. ............. 714/733 |
| 5,768,290 A | 6/1998 | Akamatsu .................. 714/732 |
| 5,821,770 A | 10/1998 | Rees .......................... 326/38 |
| 5,844,803 A | 12/1998 | Boffa ......................... 700/121 |
| 5,907,492 A | 5/1999 | Akram et al. ............... 700/121 |
| 5,915,231 A | 6/1999 | Beffa .......................... 702/118 |
| 6,194,738 B1 | * 2/2001 | Debenham et al. ........... 257/48 |
| 6,205,064 B1 | * 3/2001 | Ooishi ........................ 365/200 |
| 6,385,739 B1 | * 5/2002 | Barton et al. ................ 714/25 |

FOREIGN PATENT DOCUMENTS

JP        11297775 A    * 10/1999

* cited by examiner

*Primary Examiner*—Stephen D. Meier
*Assistant Examiner*—Jamie L. Brophy
(74) *Attorney, Agent, or Firm*—Joanna G. Chiu; M. Kathryn Braquet Tsirigotis

(57) ABSTRACT

An apparatus and methods for testing a semiconductor integrated circuit are disclosed. One embodiment includes a method for making a pass/fail determination in a semiconductor integrated circuit device. The method includes executing a test on the device after assembly and determining a pass/fail state of the device in response to the test. The method further includes programming a test history fuse on the semiconductor integrated circuit device to store a pass/fail state of the device. Another embodiment further includes performing a final test on the device, wherein if the stored pass/fail state indicates a pass state, a reduced final test is executed. A semiconductor integrated circuit device including internal circuitry, self test circuitry, and test history fuse circuitry is also disclosed.

14 Claims, 2 Drawing Sheets

METHOD FOR TESTING A SEMICONDUCTOR INTEGRATED CIRCUIT DEVICE

FIELD OF THE INVENTION

The present invention relates to pass/fail determination techniques for semiconductor integrated circuit device.

RELATED ART

Products with non-volatile memory have proven the cost savings achievable by removing the most time-consuming tests from final test and instead performing those tests during the several hour burn-in step that precedes final test. Products with non-volatile memory simply program their own pass/fail code into the non-volatile memory during burn-in. This saves tens of seconds of testing during final test since it now only takes milliseconds to verify the pass code stored during burn-in. The present invention proposes utilization of a built-in self test (BIST) to burn or program one or more fuses during test-in burn-in. The fuses will be checked in the subsequent final test step to verify if the extended test battery passed or failed. The present invention significantly reduces final test time and increases test capacity and quality assurance.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

As used herein, the term "bus" is used to refer to a plurality of signals or conductors which may be used to transfer one or more various types of information, such as data, addresses, control, or status. The terms "assert" and "negate" are used when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one. Likewise, a logic level one may be referred to as a high state signal while a logic level zero may be referred to as a low state signal.

Figure 1:
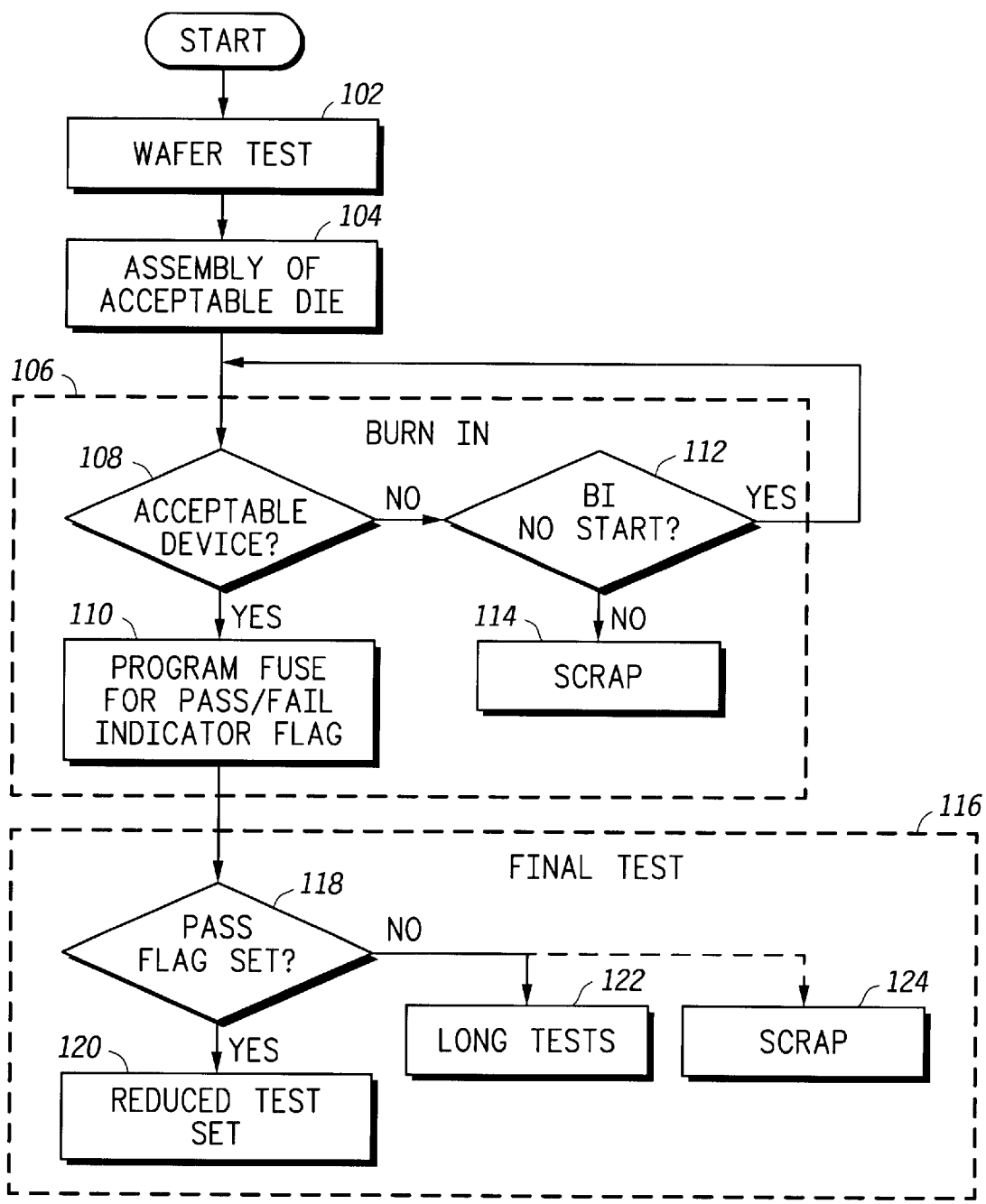
FIG. 1 is a flow chart of a pass/fail determination operation of a semiconductor integrated circuit device according to the present invention.

FIG. 1 illustrates a flow chart of a pass/fail determination operation for a semiconductor integrated circuit device according to an embodiment of the present invention. At the wafer level, a plurality of semiconductor integrated circuit devices are formed on one or more wafers and a test of each semiconductor integrated circuit device on the wafer is carried out at step 102. In the testing of the integrated circuit devices at the wafer level (wafer test), a determination is made as to whether the semiconductor integrated circuit device is unacceptable according to the results of a typical probe test performed at the wafer level. Determination made at the wafer test level as to whether each individual semiconductor integrated circuit device is acceptable or unacceptable may be registered and recorded in a computer database. For the purpose of facilitating selection of acceptable integrated circuit device products, a visible mark (such as an ink dot) is made on the defective integrated circuit device, and an additional step of a laser marked identification programming may also be done at the wafer test level. The wafer then moves to the packaging and assembly level.

At the packaging level, the semiconductor integrated circuit devices formed on the wafer are diced and separated for assembly (molding) into individual chips. The semiconductor integrated circuit devices determined as unacceptable or defective at step 102 are typically discarded or scrapped. All of the semiconductor integrated circuit devices determined to be acceptable at step 102 are then packaged and assembled at step 104. The individual semiconductor integrated circuit devices are packaged, for example molded, at step 104 and thus a semiconductor integrated circuit device as a discreet component is completed.

Burn in testing at block 106 is carried out on the semiconductor integrated circuit devices which have been assembled. The burn in test provides for electrically exercising and testing the semiconductor integrated circuit devices and captures some of the unacceptable integrated circuit devices. At block 108, a determination of acceptable or unacceptable performance as a function of the burn in tests is made within each semiconductor integrated circuit device. If the burn in test indicates that an integrated circuit device is not acceptable, a determination is made as to whether the burn in test indicated a no-start of the integrated circuit device at step 112. If the integrated circuit device indicates a no-start, the burn in tests are repeated for those integrated circuit devices or discreet components and the operation returns to the determination of an acceptable or unacceptable performance as a function of the burn in tests at step 108. If however, the burn in tests have indicated that the device is unacceptable and a no-start is not indicated, the device is typically discarded or scrapped at step 114.

If, at step 108, the burn in tests indicate that the semiconductor integrated circuit device is acceptable, the device in burn in mode sets an internal pass/fail signal register to a pass signal for providing an indication of an acceptable device. The pass/fail signal register can be used to trigger internal logic to program one or more internal fuse elements, or trigger external hardware to program an internal fuse register. Programming the one or more internal fuses can be accomplished, for example, by blowing/not blowing the fuse, cutting/not cutting the fuse or programming the fuse based register at a first or second logic level, for example, open or closed. The programmed fuse(s) provide a non-volatile test history register for the integrated circuit device.

In some embodiments of the present invention, the semiconductor integrated devices under test include both a logic portion and a memory portion. For example, the memory portion can be an embedded volatile memory portion. The logic portion of the devices may be designed to allow for self tests to be run on the device. For example, the tests during burn in may include self tests performed by a semiconductor integrated circuit device on itself. Alternate embodiments may perform the testing, including self tests, if any, outside of the burn in level where the test results are stored by programming a fuse or fuses on the semiconductor integrated circuit device.

One or more fuse elements in a pass/fail indicator circuit (an example of which is described in FIG. 2) are programmed at step 110 to set the pass signal or pass flag for acceptable semiconductor integrated circuit devices. The method and apparatus of the present invention allow for a built-in self-test at the test in burn in level (after packaging and assembly) to provide for reduced testing time in the final test level at block 116. The present invention also provides certain advantages in allowing for a pass/fail determination and non-volatile parameter storage without the use of non-volatile memory fabrication steps and processing costs.

At the final test level, block 116, a determination is made at decision block 118 to determine whether the pass flag is set, by carrying out a test of the programmed fuse(s) in the pass/fail indicator circuit. For those semiconductor integrated circuit devices in which the fuse registers are programmed to a pass condition, the pass flag is set and a reduced final test set can be utilized at block 120. For example, devices with large embedded memories can save tens of seconds of test time by reading a confirmation (from the non volatile test history register) that appropriate test coverage passed during the previous burn in operation. This allows for a considerably reduced test time, an increase in capacity for testing, and an increase in quality assurance of those semiconductor integrated circuit devices which pass through the final test level.

For those semiconductor integrated circuit devices in which the fuse registers are not programmed to a pass condition, then the pass flag is not set and a longer final testing will be indicated and carried out at block 122. A miss-processing event at burn in could also allow integrated circuit devices which fail the burn in tests to be advanced as "acceptable" to final testing even though they may not actually be acceptable. Ultimately, those semiconductor integrated circuit devices which do not have the pass flag set would simply be scrapped at block 124.

Figure 2:
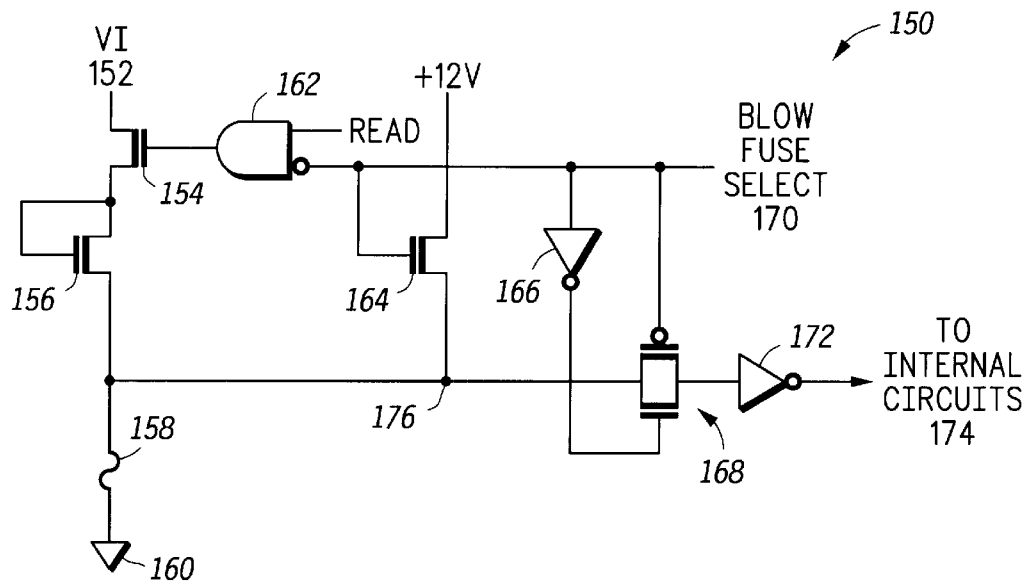
FIG. 2 is an example of an embodiment of a structure of a pass/fail indication circuit.

FIG. 2 illustrates pass/fail indication circuitry 150. Circuit 150 provides for blowing the fuse (a test history fuse circuitry portion) and for providing a read indication if such fuse is blown or not (a pass/fail determination circuitry portion). The program fuse signal is received from built-in self test circuitry (not shown) on the semiconductor integrated circuit device and/or from executing instructions from the burn in software. This burn in software is downloaded into the memory of the semiconductor integrated circuit device or chip and is executed as an additional test on the integrated circuit device. The integrated circuit device then executes the self test and/or executes the code from the burn in driver (which is external).

The program fuse signal is received at node 170 to program a pass/fail indicator by blowing fuse 158. For example, if a high state assert signal (i.e. logic 1 or logic high) is input at node 170, transmission gate 168 is disabled such that any high voltage will not spike the internal circuits at node 174. The logic high from node 170 then goes to AND gate 162 which prevents AND gate 162 from outputting a logic high signal (due to the inverted input to gate 162 from node 170, as indicated by the circle at the AND gate input). This assures that AND gate 162 is not in a read mode. The output of AND gate 162 is connected to the gate of transistor 154 which is disabled when the output of AND gate 162 is at a logic low.

Node 170 (the program fuse select signal) is also connected to the gate of high power transistor 164 which is enabled or turned on at the assertion of a high signal (i.e. a logic high) at node 170. The source of high powered transistor 164 is connected to a high voltage such as 12V. Fuse 158 is connected to the drain of transistor 164 and ground node 160 wherein when transistor 164 is enabled (by a logic high signal applied to its gate), it couples +12 volts to ground 160 through fuse 158, thereby blowing fuse 158.

The status of test history fuse 158 can then be read in the final test level to determine whether the fuse is blown thereby indicating that the pass flag is set. This portion of the circuit can be referred to as the pass/fail determination circuitry. To read the status of the test history fuse of pass/fail indication circuitry 150, a high (logic 1) state is asserted at the read input and a low (logic 0) state is asserted at the program fuse signal input at node 170 such that the output of AND gate 162 goes to a logic high thereby enabling transistor 154. The logic low signal at node 170 disables high power transistor 164. The logic low signal at node 170 also enables transmission gate 168 such that the voltage state at node 176 is sent to internal circuits through connection 174. If fuse 158 is blown and thereby disconnected from ground 160, weak pull-up transistor 156 provides for a small voltage drop across pull-up transistor 156 such that the voltage reading at node 176 provides for a logic 1 to inverter 172 which then outputs a logic 0 to connection 174 to the internal circuits. However, if fuse 158 is not blown, connection to ground 160 is maintained and node 176 is pulled to ground which provides for a logic 0 or low state to inverter 172 which then outputs a logic 1 to connection 174 to the internal circuits. Therefore, pass/fail indication circuitry 150 provides, at the final test level, a reading or indication of whether fuse 158 is blown which indicates whether or not a pass flag is set.

Although pass/fail indication circuitry 150 is described in the embodiment illustrated in FIG. 2 as providing for programming a test history fuse 158, the program fuse signal can also be asserted to trigger an external means connected to the fuse in order to blow the fuse (not shown). The circuitry illustrated in FIG. 2 is illustrated as an example of an embodiment of the method and apparatus of the present invention and should not be taken as limiting the circuitry design applicable in the method and apparatus of the present invention. Furthermore, the circuit 150 of FIG. 2 illustrates a method of blowing or not blowing a fuse to indicate a pass or fail condition; however, alternate embodiments may use different circuits containing different types of fuses that may be programmed in a variety of different ways. The circuit of FIG. 2 should not be limited to the programming of a fuse through blowing or not blowing an electrical fuse since alternate circuits can accomplish the same or similar objectives.

Figure 3:
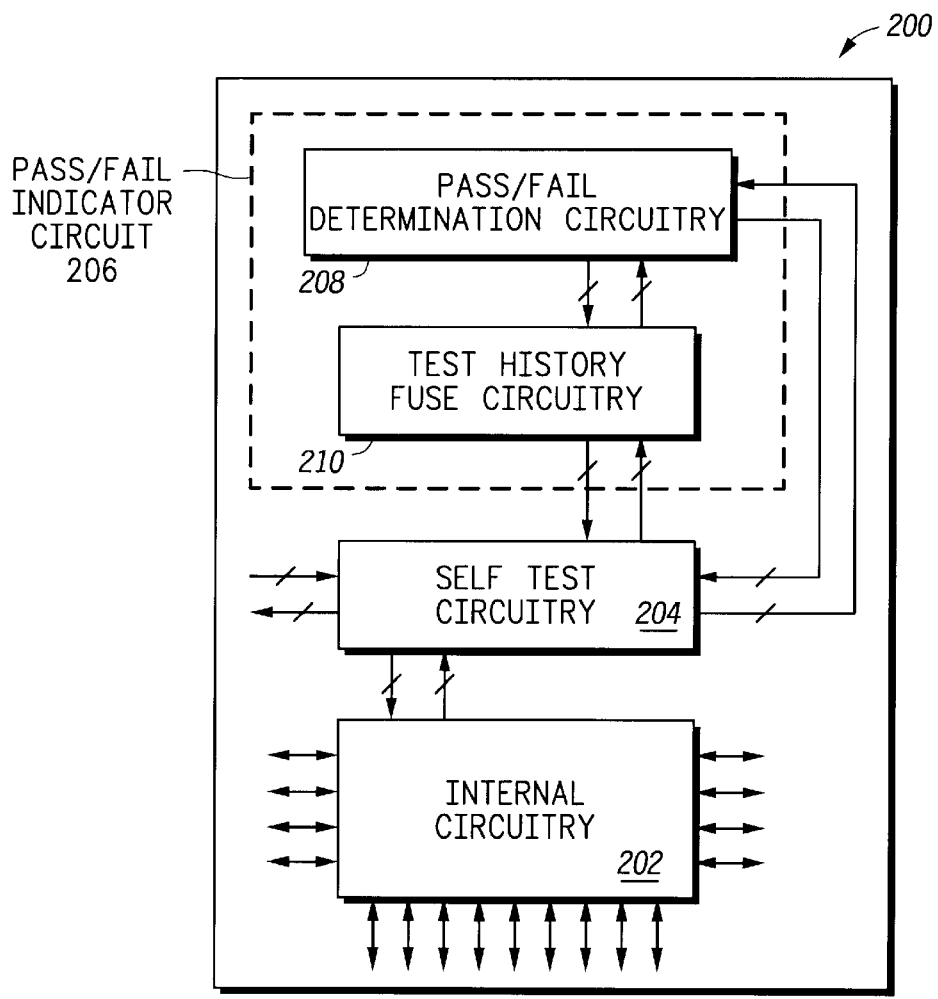
FIG. 3 is a block diagram illustrating a schematic structure of main components of a semiconductor integrated circuit device according to the present invention.

FIG. 3 is a block diagram illustrating a schematic structure of main components of a semiconductor integrated circuit device according an embodiment of the present invention. Referring to FIG. 3, semiconductor integrated circuit device 200 includes internal circuitry 202 which includes the functionality of device 200 designed for use by an end user. For example, internal circuitry 202 may include a microcontroller, digital signal microprocessor, or any other variety of device or microprocessor. Internal circuitry 202 may also include embedded memory.

Semiconductor integrated circuit device 200 also includes self test circuitry 204, coupled to internal circuitry 202, for determining whether the programming of the one or more fuse elements in pass/fail indicator circuit 206 are specified as pass or fail. Pass/fail indicator circuit 206 further includes pass/fail determination circuitry 208 and test history fuse circuitry 210. One embodiment of pass/fail indicator circuit 206 is illustrated by pass/fail indicator circuit 150 of FIG. 2.

Self test circuitry 204 has a plurality of inputs from internal circuitry 202 of semiconductor integrated circuit device 200 and an output to provide a pass/fail signal to pass/fail indicator circuit 206. Self test circuitry 204 determines a pass/fail state of device 200 and generates the pass/fail signal in response to the pass/fail state. Test history fuse circuitry 210 includes a fuse (not shown this figure) and an input to receive the pass/fail signal from self test circuitry 204. Test history fuse circuitry 210 is adapted to provide for programming the fuse in response to the pass/fail signal. Pass/fail determination circuitry 208 has an output to provide the pass/fail state of device 200, for example, to self test circuitry 204 or an external circuit.

Although the invention has been described with respect to specific conductivity types or polarity of potentials, skilled artisans appreciated that conductivity types and polarities of potentials may be reversed.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A pass/fail determination method for a semiconductor integrated circuit device, comprising:
   executing a test on the semiconductor integrated circuit device, after assembly, to obtain a test result;
   programming a fuse on the semiconductor integrated circuit device to indicate a pass/fail state of the semiconductor integrated circuit device as a function of the test result; and
   performing a final test on the semiconductor integrated circuit device, wherein if the programmed fuse indicates a pass state, a first final test is executed and if the programmed fuse indicates a fail state, a second final test is executed.

2. The method of claim 1, wherein the test is executed during a burn in process.

3. The method of claim 2, wherein the test is a self test performed by the semiconductor integrated circuit device.

4. The method of claim 1, wherein the test is a self test performed by the semiconductor integrated circuit device.

5. The method of claim 4, wherein the semiconductor integrated circuit device includes a logic portion and a memory portion.

6. The method of claim 5, wherein the memory portion includes volatile memory.

7. The method of claim 1, wherein programming the fuse comprises selectively blowing the fuse to indicate the pass/fail state of the semiconductor integrated circuit device.

8. The method of claim 7, wherein the fuse is electrically blown when the semiconductor integrated circuit device passes the test.

9. The method of claim 1, wherein the second final test has a longer execution time than the first final test.

10. A pass/fail determination method for a semiconductor integrated circuit device having volatile memory, comprising:
    executing a self test on the semiconductor integrated circuit device after assembly;
    determining a pass/fail state of the device in response to the self test;
    programming a test history fuse on the semiconductor integrated circuit device to store the pass/fail state of the semiconductor integrated circuit device; and
    performing a final test on the semiconductor integrated circuit device, wherein if the stored pass/fail state indicates a fail state, a long final test is executed, and if the stored pass/fail state indicates a pass state, a reduced final test is executed, wherein the long final test has a longer execution time than the reduced final test.

11. The method of claim 10, wherein the self test is performed during burn in.

12. The method of claim 11, wherein programming the test history fuse comprises blowing the test history fuse to indicate a pass state.

13. The method of claim 12, wherein the test history fuse is electrically blown.

14. The method of claim 10, wherein performing the final test comprises:
    utilizing the stored pass/fail state of the semiconductor integrated circuit device to selectively discard the semiconductor integrated circuit device.

* * * * *